(12) United States Patent
Kosaka et al.

(10) Patent No.: US 7,084,355 B2
(45) Date of Patent: Aug. 1, 2006

(54) MULTILAYER PRINTED CIRCUIT BOARD

(75) Inventors: Yoshiyuki Kosaka, Oumihachiman (JP); Kazuyasu Sugisawa, Moriyama (JP); Kimihiro Yamanaka, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 352 days.

(21) Appl. No.: 10/409,792

(22) Filed: Apr. 8, 2003

(65) Prior Publication Data

US 2003/0214797 A1    Nov. 20, 2003

(30) Foreign Application Priority Data

May 15, 2002  (JP) .............................. 2002-139876

(51) Int. Cl.
*H01R 12/04* (2006.01)

(52) U.S. Cl. ........................................ 174/262; 174/261

(58) Field of Classification Search ................ 174/254, 174/255, 260, 266, 262; 361/792–795
See application file for complete search history.

(56) References Cited

U.S. PATENT DOCUMENTS

| | | | |
|---|---|---|---|
| 374,831 A | 12/1887 | Harrington | 128/207.12 |
| 440,713 A | 11/1890 | Krohn et al. | 128/206.28 |
| 1,695,170 A | 12/1928 | Burdick | 128/207.12 |
| 1,998,327 A | 4/1935 | McGuire | 128/203.27 |
| 2,164,330 A | 7/1939 | Katz et al. | 128/201.19 |
| 2,381,568 A | 8/1945 | Booharin | 128/201.15 |
| 2,432,946 A | 12/1947 | Theunissen | 128/206.21 |
| 2,848,994 A | 8/1958 | Aguado | 128/207.11 |
| 2,931,356 A | 4/1960 | Schwarz | 128/206.24 |
| 2,985,169 A | 5/1961 | Elling | 128/205.24 |
| 4,470,412 A | 9/1984 | Nowacki et al. | 128/200.18 |
| 4,809,692 A | 3/1989 | Nowacki et al. | 128/206.24 |
| 4,832,015 A | 5/1989 | Nowacki et al. | 128/205.23 |
| 4,927,983 A | 5/1990 | Jones et al. | 174/258 |
| 5,012,803 A | 5/1991 | Foley et al. | 128/200.23 |
| 5,097,593 A | 3/1992 | Jones et al. | 29/852 |
| 5,109,839 A | 5/1992 | Blasdell et al. | 128/203.12 |
| 5,450,290 A * | 9/1995 | Boyko et al. | 361/792 |
| 6,392,164 B1 * | 5/2002 | Iwaki et al. | 174/262 |
| 6,492,008 B1 * | 12/2002 | Amagi et al. | 428/209 |
| 2002/0100610 A1 * | 8/2002 | Yasuda et al. | 174/260 |
| 2002/0157860 A1 * | 10/2002 | Umemura | 174/252 |

FOREIGN PATENT DOCUMENTS

| | | |
|---|---|---|
| JP | 62-6357 | 1/1987 |
| JP | 8-8538 | 1/1996 |

(Continued)

*Primary Examiner*—Kamand Cuneo
*Assistant Examiner*—Yuriy Semenenko
(74) *Attorney, Agent, or Firm*—Scully, Scott, Murphy & Presser; David L. Adour, Esq.

(57) ABSTRACT

A multilayer printed circuit board is provided in which microcracks or metallic migration is mitigated when a Resin Fill Plated Through Hole (RFP) is arranged near the edge thereof. The multilayer printed circuit board includes an inner layer having an RFP, outer layers, RFP lands, and conductor layers. The conductor layers are positioned over the RFP lands and the outer edges of the conductor layers extends outward further than the outer edges of the RFP lands. When the multilayer printed circuit board is heated, a stress is generated in and near the RFP. The conductor layers positioned so as to cover the RFP lands, exert a reaction against the stress to suppress generation of microcracks in the multilayer printed circuit board and thereby mitigate metallic migration in the board.

6 Claims, 3 Drawing Sheets

FOREIGN PATENT DOCUMENTS

| | | |
|---|---|---|
| JP | 10-341077 | 12/1998 |
| JP | 2000-151103 | 5/2000 |
| JP | 2000-1888478 | 7/2000 |
| JP | 2000-216551 | 8/2000 |

* cited by examiner

MULTILAYER PRINTED CIRCUIT BOARD

FIELD OF THE INVENTION

The present invention relates to a multilayer printed circuit board including a chip carrier, and more specifically to a multilayer printed circuit board having a Resin Filled Plated Through Hole (RFP) and RFP lands.

BACKGROUND OF THE INVENTION

In general, a multilayer printed circuit board includes an internal layer and an external layer on both sides of the internal layer. Through holes can be formed in the inner layer connecting wiring on the front side and on the back side of the internal layer. Some of the through holes, can be RFPs. Since the inside of an individual RFP is resin filled, a conductor or wiring can also be positioned directly on the resin fill in the RFP.

A region within about 0.5 millimeters (mm) from the edge of a multilayer printed circuit board is usually not utilized as a wiring region or does not include RFPs for the following reasons. Since an RFP includes a conductor on its inner circumference wall and the RFP is filled with resin, upon heating of the multilayer printed circuit board, a stress can be generated in a Z-direction (direction perpendicular to a principal surface of a multilayer printed circuit board) because resin and copper differ in their coefficient of thermal expansion. An RFP arranged near the edge of a multilayer printed circuit board, can experience microcracking due to the thermal stress when the multilayer printed circuit board is heated in high-temperature high-humidity test, solder reflow processing or even during operation. Microcracking can also occur in the layers in the vicinity of the RFP. When microcracks are generated, moisture permeation can occur and copper migration is likely.

In the case of a Chip Scale Package (CSP) wherein the size of a multilayer printed circuit board is equal to or slightly greater than the size of a semiconductor chip mounted thereon, inasmuch as wiring area is limited, the necessity for having an RFP and/or wiring as close as possible to the edge of the multilayer printed circuit board has been increasing.

Accordingly there is a need in the art for an improved multilayer printed circuit board wherein a buried-type through hole such as an RFP and/or wiring can be located near the edge thereof, by overcoming the disadvantages of the known structure.

An object of the present invention is to provide a multilayer printed circuit board having a resin filled plated through hole with lands near the edge of the printed circuit board, the plated through hole and multilayer printed circuit board having a much lower tendency for cracking under stress.

SUMMARY OF THE INVENTION

According to one aspect of the invention, there is provided a multilayer printed circuit board comprising an inner layer including a buried-type through hole having a side wall and a through-hole conductor on the side wall. The inside of the buried-type through hole is filled with resin. An outer layer is formed on the inner layer. There is a land between the inner layer and the outer layer connected to the through-hole conductor. An outer edge of the land is within about 0.055 mm of an edge of the multilayer printed circuit board. A conductor layer is formed on the outer layer, the conductor layer completely overlying the land and extending outward further than the outer edge of the land.

According to another aspect of the invention, there is provided a multilayer printed circuit board comprising an inner layer including a first surface and a second surface opposite the first surface. There is a buried-type through hole having a side wall and a through-hole conductor on the side wall. The inside of the buried-type through hole is filled with resin. A first outer layer is provided on the first surface and a second outer layer is provided on the second surface of the inner layer. A first land is between the first surface of the inner layer and the first outer layer and connected to the through-hole conductor. An outer edge of the first land is within about 0.055 mm of an edge of the multilayer printed circuit board. A second land is between the second surface of the inner layer and the second outer layer and connected to the through-hole conductor. An outer edge of the second land is within about 0.055 mm of the edge of the multilayer printed circuit board. A first conductor layer is formed on the first outer layer. The first conductor layer completely overlies the first land and extends outward further than the outer edge of the first land. A second conductor layer is formed on the second outer layer. The second conductor layer completely overlies the second land and extends outwardly further than the outer edge of the second land.

The above objects, advantages, and features of the present invention will become more readily apparent from the following detailed description of the preferred embodiments as illustrated in the accompanying drawings.

BEST MODE FOR CARRYING OUT THE INVENTION

Figure 1:
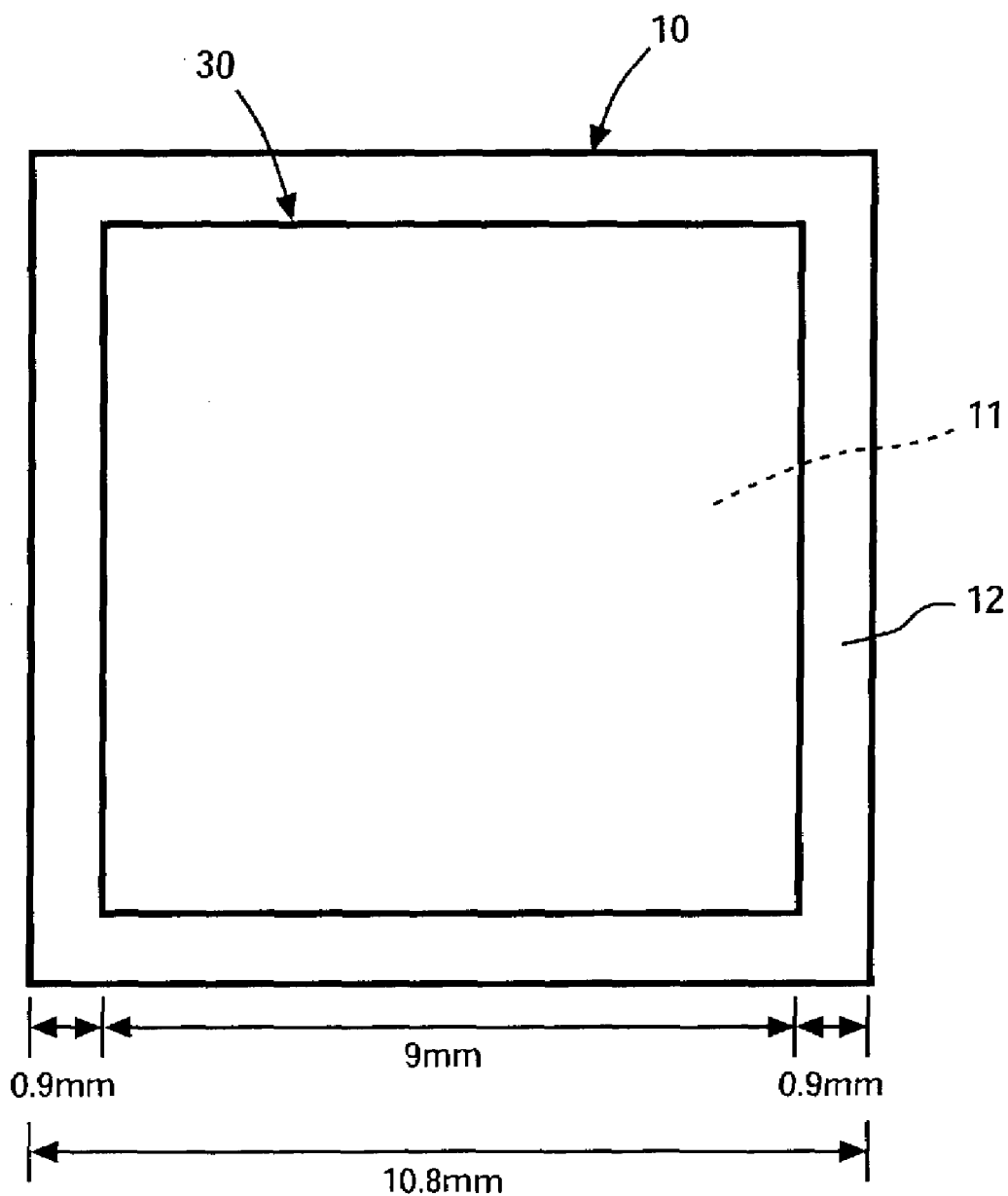
FIG. 1 is a plan view showing an external appearance of a CSP including a multilayer printed circuit board according to a preferred embodiment of the present invention.

Hereinbelow, a preferred embodiment of the present invention will be described in detail with reference to the drawings. In the drawings, the same or corresponding portions are assigned the same reference symbols so as to take advantage of explanation therefor.

FIG. 1 is a plan view showing an external surface of a multilayer printed circuit board 10 according to one embodiment of the present invention. A semiconductor chip 30 is mounted on multilayer printed circuit board 10. The semiconductor chip 30 has many terminals (not shown) arranged in a matrix on the underside thereof. The multilayer printed circuit board 10 has many pads (not shown) on its surface thereof correspondingly to the terminals of semiconductor chip 30. These terminals and corresponding pads are connected to each other by means of a solder connection, so that semiconductor chip 30 is mounted on multilayer printed circuit board 10.

The package shown in FIG. 1 is known as a CSP wherein multilayer printed circuit board 10 is only slightly greater in size than semiconductor chip 30. Specifically, the size of semiconductor chip 30 is 9 mm×9 mm, while the size of multilayer printed circuit board 10 is 10.8 mm×10.8 mm (i.e. each side of the multilayer printed circuit board being greater in length than that of the semiconductor chip by 20%). Therefore, in this example, the ratio of the area of semiconductor chip 30 to the area of multilayer printed circuit board 10 is about 69%. Namely, multilayer printed circuit board 10 has at the center thereof a chip mounting region 11 of as much as about 69% of the whole available external area, and thus has a wiring region 12 of only about 31% of the whole available external area therearound.

Figure 2:
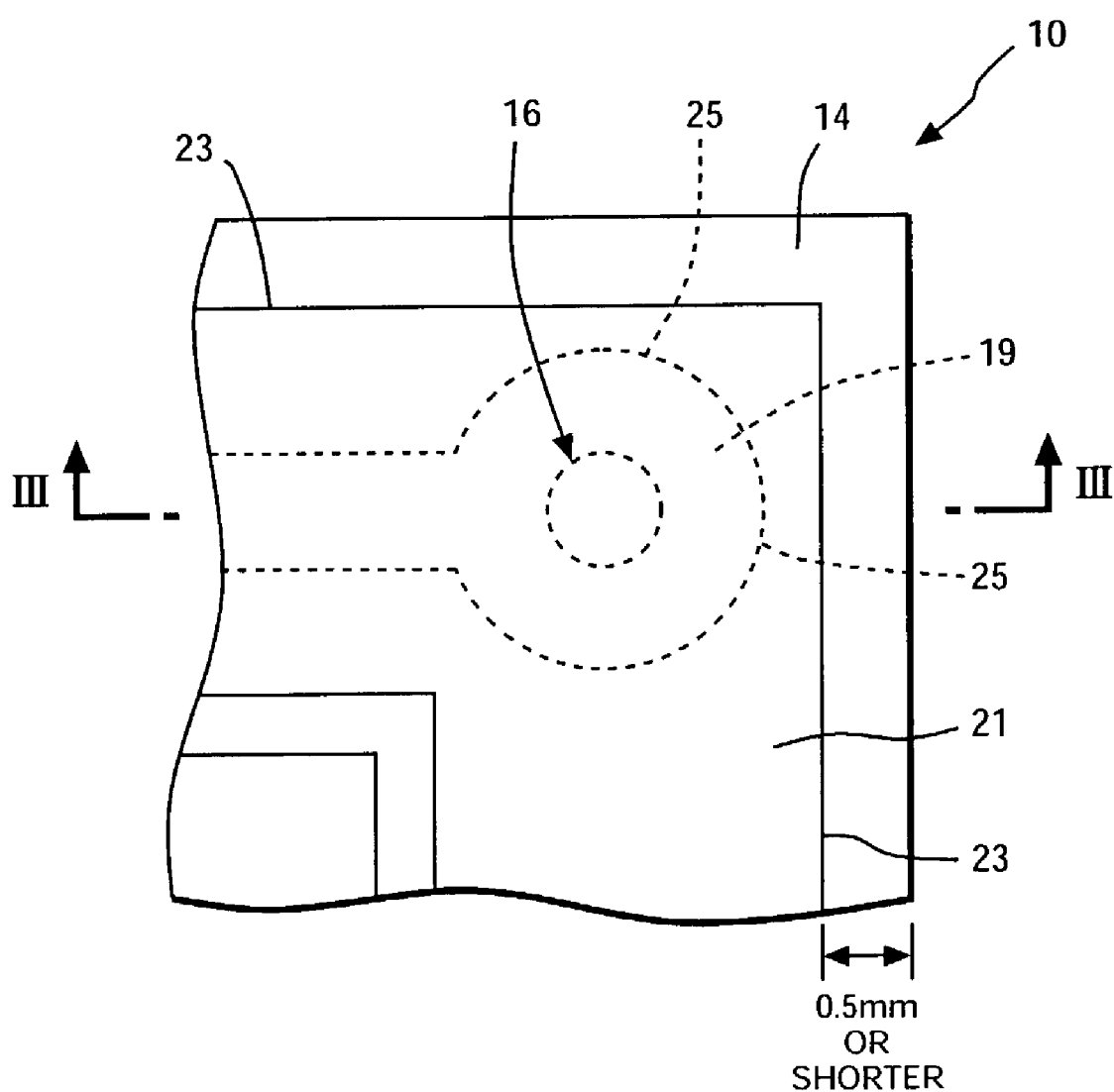
FIG. 2 is an enlarged plan view showing a section of the multilayer printed circuit board shown in FIG. 1.
Figure 3:
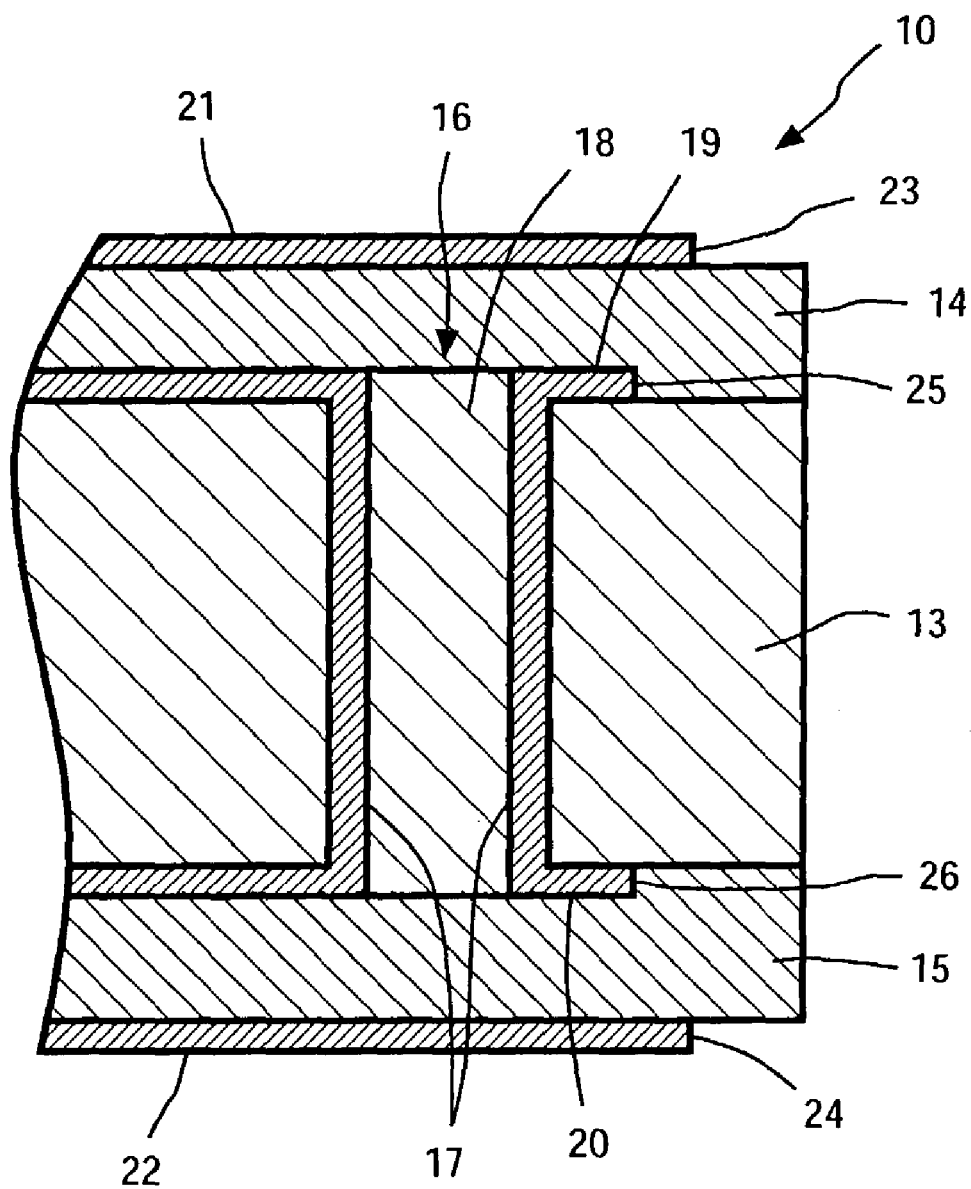
FIG. 3 is a partial sectional view in elevation of the multilayer printed circuit board of FIG. 2 taken along the line III—III in FIG. 2.

FIG. 2 is an enlarged plan view showing a section of multilayer printed circuit board 10. FIG. 3 is a partial sectional view in elevation of the multilayer printed circuit board in FIG. 2 taken along the line III—III in FIG. 2.

As shown in FIGS. 2 and 3, multilayer printed circuit board 10 includes an inner layer 13 (not shown in FIG. 2) comprised of an insulator such as resin, and outer layers 14 and 15 (not shown in FIG. 2) formed on both sides thereof. Each of outer layers 14 and 15 comprises an insulator such as photosensitive resin formed by a build-up process.

Referring to FIG. 3, inner layer 13 has an RFP 16 therein. The RFP 16 is a buried-type through hole that is formed by drilling a through hole in inner layer 13, forming a through-hole conductor 17 on the inner circumference wall thereon by copper plating or the like, and then filling the inside thereof with resin 18. The RFP is a Plated Through Hole (PTH), having a resin fill. Since the RFP is filled with the resin, a conductor can be placed thereon, if desired.

The multilayer printed circuit board 10 further comprises RFP lands 19 (see FIG. 2 also) and 20 each comprised of copper on inner layer 13. The RFP land 19 is formed between inner layer 13 and outer layer 14 around RFP 16. The RFP land 20 is formed between inner layer 13 and outer layer 15 around RFP 16. The RFP lands 19 and 20 are connected to through-hole conductor 17.

The multilayer printed circuit board 10 further comprises conductor layers 21 and 22 formed on outer layers 14 and 15, respectively. Conductor layers 21 and 22 can be comprised of copper and have a thickness of from about 10 microns (μm) to about 36 μm and can be formed on outer layers 14 and 15 by plating, sputtering, or by lamination of a copper foil followed by etching. Outer edges 23 (see FIG. 2 also) and 24 of conductor layers 21 and 22 extend outward further than outer edges 25 and 26 of RFP lands 19 and 20, respectively. Namely, conductor layers 21 and 22 are formed so as to completely cover RFP lands 19 and 20, respectively.

A distance from each of the outer edges 25 and 26 of RFP lands 19 and 20 to corresponding ones of outer edges 23 and 24, respectively, of conductor layers 21 and 22 is at least about 50 μm. Each of outer edges 23 and 24 of conductor layers 21 and 22 is within about 0.5 mm from the edge of multilayer printed circuit board 10, i.e. the edge is an area without wiring in known multilayer printed circuit boards.

Conductor layers 21 and 22 can be a ground pattern having a relatively large area. Conductor layers 21 and 22 can comprise a power supply pattern or signal line pattern.

As described above, RFP lands 19 and 20 and through-hole conductor 17 are made of copper, while inner layer 13 and outer layers 14 and 15 are made of resin. Furthermore, the inside of RFP 16 is filled with resin 18. The thermal expansion coefficient of copper is about 17 parts per million per degree Celsius (ppm/° C.), while the thermal expansion coefficient of resin is greater than copper and is about 50 to about 60 ppm/° C. Thus, when multilayer printed circuit board 10 is heated during processing, testing, or operational thermal cycling, a stress is generated in the Z-direction in the vicinity of and in RFP 16. Importantly, in multilayer printed circuit board 10, conductor layers 21 and 22 are formed so as to completely cover RFP lands 19 and 20. Accordingly, a reaction against the stress is exerted so that generation of microcracks in outer layers 14 and 15 near RFP 16 can be suppressed, eliminating microcracking.

Further, inasmuch as conductor layers 21 and 22 are formed so as to cover RFP lands 19 and 20, permeation of moisture from the surface of multilayer printed circuit board 10 can be suppressed. Consequently, generation of copper migration between the layers can be suppressed. Moreover, since the microcracks are prevented from occurring in outer layers 14 and 15 as described above, the migration preventing effect is very significant.

In the foregoing embodiment, one outer layer 14 or 15 is formed on each side of inner layer 13. However, a plurality of outer layers may be formed on each side of the inner layer 13. In this event, it is not necessarily required that a conductor layer for covering the RFP land be formed on the outermost outer layer, i.e. the conductor layer may be formed on the innermost outer layer or intermediate outer layer. It is sufficient that the conductor layer completely covers the RFP land. Further, the shape of the conductor layer covering the RFP land can be any shape that surpresses Z direction stress near and in the RFP.

In the foregoing embodiment, outer layers 14 and 15 formed on both sides of the inner layer 13 are shown as symmetrical to each other. However, they may be asymmetrical to each other. Further, the outer layer is not necessarily formed on each side of the inner layer, but may be formed on only one side of the inner layer.

In the foregoing embodiment, each of RFP lands 19 and 20 are shown as surrounding RFP 16. However, each of these may be formed into a disk shape covering the entire hole region of the RFP 16. In such a land structure, the problem of the microcracks is reduced, but there still remains a possibility of occurrence thereof. The present invention is also effective for preventing generation of microcracks in such a structure.

The preferred embodiment of the present invention has been described above, which, however, is only one example for embodying the present invention. Therefore, the present invention is not limited to the foregoing embodiment, but can be embodied by properly modifying the foregoing embodiment within a range without departing from the scope of the present invention.

What is claimed is:

1. A multilayer printed circuit board comprising:
   an inner layer including a buried-type through hole having a side wall and a through-hole conductor formed by copper plating on said side wall, the inside of said buried-type through hole being filled with resin, said through-hole conductor having a thermal expansion coefficient of about 17 ppm/° C., and the resin in said buried-type through hole has a thermal expansion coefficient greater than that of said through-hole conductor;
   an outer layer formed on said inner layer;
   a land between said inner layer and said outer layer and connected to said through-hole conductor, an outer edge of said land being within about 0.055 mm of an edge of said multilayer printed circuit board; and
   a conductor layer formed on said outer layer, said conductor layer having a size and strength to prevent microcracks in said multiplayer printed circuit board when said board is heated during operation or testing, said conductor layer completely overlying said land and extending outward further than said outer edge of said land, wherein a distance from said outer edge of said land to an outer edge of said conductor layer is at least about 50 μm, and wherein said outer edge of said conductor layer is within about 0.5 mm from said edge of said multilayer printed circuit board.

2. The multilayer printed circuit board according to claim 1, wherein said thermal expansion coefficient of said resin is from about 50 to about 60 ppm/° C.

3. The multilayer printed circuit board according to claim 1, further comprising a chip mounting region for mounting a semiconductor chip, wherein the ratio of an area of said chip mounting region to an area of a principal surface of said multilayer printed circuit board is about 69% or greater.

4. The multilayer printed circuit board comprising:
- an inner layer including a first surface and a second surface opposite said first surface, a buried-type through hole having a side wall and a through-hole conductor formed by copper plating on said side wall, the inside of said buried-type through hole filled with resin, said through-hole conductor has a thermal expansion coefficient of about 17 ppm/° C., and the resin in said buried-type through-hole has a thermal expansion coefficient greater than that of said through-hole conductor;
- a first outer layer on said first surface and a second outer layer on said second surface of said inner layer;
- a first land between said first surface of said inner layer and said first outer layer and connected to said through-hole conductor, an outer edge of said first land being within about 0.055 mm of an edge of said multilayer printed circuit board;
- a second land between said second surface of said inner layer and said second outer layer and connected to said through-hole conductor, an outer edge of said second land being within about 0.055 mm of said edge of said multilayer printed circuit board;
- a first conductor layer formed on said first outer layer, said first conductor layer completely overlying said first land and extending outward further than said outer edge of said first land; and
- a second conductor layer formed on said second outer layer, said first and second conductor layers each possessing a size and strength to prevent microcracks in said multiplayer printed circuit board when said board is heated during operation or testing, said second conductor layer completely overlying said second land and extending outward further than said outer edge of said second land, wherein a distance from said outer edges of said first and second lands to outer edges of said first and second conductor layers, respectively, is at least about 50 µm, and wherein said outer edges of said first and second conductor layers are within about 0.5 mm from said edge of said multilayer printed circuit board.

5. The multilayer printed circuit board according to claim 4, wherein said thermal expansion coefficient of said resin is from about 50 to about 60 ppm/° C.

6. The multilayer printed circuit board according to claim 4, further comprising a chip mounting region for mounting a semiconductor chip, wherein the ratio of an area of said chip mounting region to an area of said first or said second outer layer of said multilayer printed circuit board is about 69% or greater.

* * * * *